United States Patent
Worones et al.

(10) Patent No.: US 10,746,767 B2
(45) Date of Patent: Aug. 18, 2020

(54) ADJUSTABLE LENGTH ROGOWSKI COIL MEASUREMENT DEVICE WITH NON-CONTACT VOLTAGE MEASUREMENT

(71) Applicant: Fluke Corporation, Everett, WA (US)

(72) Inventors: Jeffrey Worones, Seattle, WA (US); Ronald Steuer, Hinterbruhl (AT); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 83 days.

(21) Appl. No.: 15/975,187

(22) Filed: May 9, 2018

(65) Prior Publication Data

US 2019/0346492 A1 Nov. 14, 2019

(51) Int. Cl.
*G01R 19/25* (2006.01)
*G01R 15/14* (2006.01)
(Continued)

(52) U.S. Cl.
CPC ....... *G01R 19/2503* (2013.01); *G01R 15/142* (2013.01); *G01R 15/181* (2013.01);
(Continued)

(58) Field of Classification Search
CPC .............................................. G01R 19/2503; G01R 15/202; G01R 15/205; G01R 15/181; G01R 15/142; H01F 27/2804
See application file for complete search history.

(56) References Cited

U.S. PATENT DOCUMENTS 5,473,244 A 12/1995 Libove et al.
5,583,444 A 12/1996 Nakamura et al.
(Continued)

FOREIGN PATENT DOCUMENTS

CN 2639905 Y 9/2004
EP 1 249 706 B1 9/2007
(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.
(Continued)

*Primary Examiner* — Dominic E Hawkins
(74) *Attorney, Agent, or Firm* — Seed IP Law Group LLP

(57) ABSTRACT

Systems and methods are provided for measuring electrical parameters in an insulated conductor without requiring a galvanic connection. A non-contact, electrical parameter sensor probe may be operative to measure both current and voltage in an insulated conductor. The sensor probe includes a body, a Rogowski coil coupled to the body, and a non-contact voltage sensor coupled to the body or the Rogowski coil. The size of the loop of the Rogowski coil is selectively adjustable, such that the loop may be tightened around the conductor under test until the conductor is positioned adjacent a portion of the body or Rogowski coil that includes the non-contact voltage sensor. Measured electrical parameters may be provided to a user, e.g., via a display, or may be transmitted to one or more external systems via a suitable wired or wireless connection.

19 Claims, 9 Drawing Sheets

(51) Int. Cl.
*G01R 15/18* (2006.01)
*G01R 15/20* (2006.01)
*H01F 27/28* (2006.01)

(52) U.S. Cl.
CPC ......... *G01R 15/202* (2013.01); *G01R 15/205* (2013.01); *H01F 27/2804* (2013.01)

(56) References Cited

U.S. PATENT DOCUMENTS

| | | |
|---|---|---|
| 5,973,501 A | 10/1999 | Reichard |
| 6,014,027 A | 1/2000 | Reichard |
| 6,043,640 A | 3/2000 | Lauby et al. |
| 6,118,270 A | 9/2000 | Singer et al. |
| 6,644,636 B1 | 11/2003 | Ryan |
| 6,664,708 B2 | 12/2003 | Schlimak et al. |
| 6,812,685 B2 | 11/2004 | Steber et al. |
| 6,825,649 B2 | 11/2004 | Nakano |
| 7,084,643 B2 | 8/2006 | Howard et al. |
| 7,466,145 B2 | 12/2008 | Yanagisawa |
| 8,054,061 B2 | 11/2011 | Prance et al. |
| 8,222,886 B2 | 7/2012 | Yanagisawa |
| 8,680,845 B2 | 3/2014 | Carpenter et al. |
| 8,803,506 B2 | 8/2014 | Yanagisawa |
| 9,063,184 B2 | 6/2015 | Carpenter et al. |
| 9,201,100 B2 | 12/2015 | Yanagisawa |
| 2002/0167303 A1 | 11/2002 | Nakano |
| 2006/0082356 A1* | 4/2006 | Zhang .................. G01R 15/181 324/117 R |
| 2007/0086130 A1 | 4/2007 | Sorensen |
| 2009/0058398 A1 | 3/2009 | Ibuki |
| 2010/0060300 A1 | 3/2010 | Müller et al. |
| 2010/0090682 A1 | 4/2010 | Armstrong |
| 2010/0283539 A1 | 11/2010 | Yanagisawa |
| 2011/0012589 A1* | 1/2011 | Greenberg ............. G01R 15/12 324/127 |
| 2012/0126789 A1* | 5/2012 | Turpin .................. G01R 15/181 324/117 R |
| 2012/0200291 A1 | 8/2012 | Carpenter et al. |
| 2012/0259565 A1 | 10/2012 | Oshima et al. |
| 2012/0290240 A1 | 11/2012 | Fukui |
| 2013/0076343 A1* | 3/2013 | Carpenter .............. G01R 33/02 324/202 |
| 2013/0124136 A1 | 5/2013 | Neeley et al. |
| 2013/0147464 A1 | 6/2013 | Tan |
| 2014/0035607 A1 | 2/2014 | Heydron et al. |
| 2014/0039838 A1* | 2/2014 | Katz ........................ G01R 1/04 702/188 |
| 2014/0062459 A1 | 3/2014 | El-Essawy et al. |
| 2015/0002138 A1 | 1/2015 | Fox |
| 2015/0042320 A1 | 2/2015 | Cadugan et al. |
| 2016/0047846 A1 | 2/2016 | Sharma et al. |
| 2016/0080667 A1 | 3/2016 | Stuart et al. |
| 2016/0091535 A1* | 3/2016 | Bannister ............... G01R 15/12 324/127 |
| 2016/0109486 A1 | 4/2016 | Yanagisawa |
| 2016/0119592 A1 | 4/2016 | Stuart et al. |
| 2016/0223588 A1* | 8/2016 | Fox ........................ G01R 31/58 |

FOREIGN PATENT DOCUMENTS

| | | |
|---|---|---|
| EP | 3 015 871 A1 | 5/2016 |
| FR | 2 923 019 A1 | 5/2009 |
| JP | 9-184866 A | 7/1997 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 10/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |

OTHER PUBLICATIONS

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," *IEEE Transactions on Instrumentation and Measurement* 61(9):2512-2518, 2012.

Hioki, "3258 : Safety HiTESTER," Revised Edition 5, Hioki E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.

Stuart et al., "Infrared Cameras Used As a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

Extended European Search Report for EP application No. 19173638.8 dated Oct. 2, 2019, 9 pages.

* cited by examiner

ADJUSTABLE LENGTH ROGOWSKI COIL MEASUREMENT DEVICE WITH NON-CONTACT VOLTAGE MEASUREMENT

BACKGROUND

Technical Field

The present disclosure generally relates to electrical parameter measurement devices, and more particularly, to sensor probes for electrical parameter measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

General purpose multimeters employing internal current shunts may be generally limited to ten amperes maximum, for example, because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact current measuring instrument that requires no internal fuse.

Clamp-on multimeters provide improved capability for measuring current over general purpose multimeters by employing an integral current clamp which senses the current in the current-carrying conductor without having to cut the current-carrying conductor or break the circuit including the current-carrying conductor. A current clamp is typically provided in the same housing with a multimeter which measures other parameters such as voltage and resistance in the conventional manner using separate test probes. The current clamp is closed around the current-carrying conductor, which may include a copper wire or buss bar, for example, to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured has largely been eliminated. Likewise, the internal fuse has been eliminated in clamp-on multimeters.

In order to obtain a valid current measurement, the magnetic core in the current clamp must encircle the current-carrying conductor so that the current clamp is closed. The current clamp must be mechanically actuated to open the jaws, the current-carrying conductor inserted, and the jaws then closed around the current-carrying conductor. In tight physical spaces such as an electrical cabinet, inserting the clamp-on multimeter and using this technique to make a current measurement may be inconvenient and difficult. Moreover, the jaws must be aligned to complete the magnetic core for obtaining a valid current measurement. Clamp-on multimeters are therefore difficult to use in confined spaces and require a large physical space in which to open the jaws of the current clamp. Clamp-on multimeters also tend to be physically heavy because of the substantial amount of iron used on the magnetic core. Furthermore, high levels of current may saturate the magnetic core. The current measuring capacity of the clamp-on multimeter is accordingly limited to current levels that do not saturate the magnetic core.

A Rogowski coil is able to sense alternating current flowing through a conductor surrounded by the Rogowski coil. There are a number of differences between the Rogowski coil and a clamp. For example, a Rogowski coil is more flexible and has a smaller cross-section than the substantially rigid clamp of the multimeter. The Rogowski coil can accordingly be used in confined spaces that are too tight and/or too small for the clamp-type multimeter. Further, the loop of a Rogowski coil can be reshaped to surround conductors having cross-sections that the clamp cannot close around. Another difference is the greater current measuring capability of the Rogowski coil as compared to the clamp. Specifically, an air core of a Rogowski does not become saturated at levels of current that saturate the magnetic material of the cores of the clamp.

BRIEF SUMMARY

An electrical parameter sensor probe operative to detect an electrical parameter in an insulated conductor without requiring galvanic contact with the insulated conductor may be summarized as including a Rogowski coil; a body comprising a first channel and a second channel, the first and second channels having respective first and second open ends, the respective first ends of the first and second channels being spaced apart from each other, and the respective second ends of the first and second channels being adjacent each other, each of the first and second channels sized and dimensioned to slidably contain a respective length of the Rogowski coil therein such that a loop of the Rogowski coil is formed between the respective first open ends of the first and second channels, and the size of the loop is selectively adjustable by movement of the Rogowski coil within at least one of the first and second channels; and a non-contact sensor coupled to the body and positioned between the respective first ends of the first and second channels, the non-contact sensor operative to sense at least one electrical parameter in the insulated conductor when the insulated conductor is within the loop formed by the Rogowski coil.

The second channel of the body may include a lateral opening that extends between the first and second open ends, the lateral opening sized and dimensioned to allow a length of the Rogowski coil to be selectively inserted into and removed from the second channel. The lateral opening may have a width that is less than a diameter of the Rogowski coil, and at least a portion of the second channel adjacent the lateral opening may be formed from a flexible material that elastically deforms to allow the length of the Rogowski coil to be selectively inserted into and removed from the second channel. The second channel of the body may include a fastener operative to allow a length of the Rogowski coil to be selectively inserted into and removed from the second channel. The Rogowski coil may be not removable from the first channel during normal use of the electrical parameter sensor probe. The non-contact sensor may include at least one of a non-contact voltage sensor or a non-contact current sensor.

The electrical parameter sensor probe may further include a non-contact voltage sensor coupled to the Rogowski coil, the non-contact voltage sensor operative to sense a voltage in the insulated conductor when the insulated conductor is within the loop formed by the Rogowski coil.

The electrical parameter sensor probe may further include an interface connector operatively coupled to the non-contact sensor and the Rogowski coil, the interface connector being detachably coupleable to a corresponding interface connector of a main body of a non-contact electrical parameter measurement device. The non-contact sensor may include at least one of a non-contact voltage sensor, a Hall Effect sensor, a fluxgate sensor, an anisotropic magnetoresistance (AMR) sensor, or a giant magnetoresistance (GMR) sensor.

A device for measuring an electrical parameter in an insulated conductor may be summarized as including an electrical parameter sensor probe, including a Rogowski coil; a body comprising a first channel and a second channel, the first and second channels having respective first and second open ends, the respective first ends of the first and second channels being spaced apart from each other, and the respective second ends of the first and second channels being adjacent each other, each of the first and second channels sized and dimensioned to slidably contain a respective length of the Rogowski coil therein such that a loop of the Rogowski coil is formed between the respective first open ends of the first and second channels, and the size of the loop is selectively adjustable by movement of the Rogowski coil within at least one of the first and second channels; and a non-contact sensor coupled to the body and positioned between the respective first ends of the first and second channels, the non-contact sensor operative to sense at least one electrical parameter in the insulated conductor when the insulated conductor is within the loop formed by the Rogowski coil; and control circuitry communicatively coupleable to the non-contact sensor and the Rogowski coil, in operation, the control circuitry: receives sensor data indicative of signals detected at least one of the non-contact sensor or the Rogowski coil; and processes the received sensor data to determine at least one electrical parameter of the insulated conductor.

The device may further include a main body that contains the control circuitry. The main body may include at least one interface connector, and the electrical parameter sensor probe may be detachably connectable to the at least one interface connector of the main body. The device may further include a main body that includes the electrical parameter sensor probe and the control circuitry. The control circuitry, in operation, may process the received sensor data to determine a voltage in the insulated conductor. The control circuitry, in operation, may process the received sensor data to determine a voltage and a current in the insulated conductor.

The device may further include a wireless communications subsystem operatively coupled to the control circuitry, in operation, the wireless communication subsystem wirelessly transmits the determined electrical parameter to an external system.

The device may further include a display that, in operation, visually presents the determined electrical parameter to a user of the device. The non-contact sensor may include at least one of a non-contact voltage sensor, a Hall Effect sensor, a fluxgate sensor, an anisotropic magnetoresistance (AMR) sensor, or a giant magnetoresistance (GMR) sensor.

An electrical parameter sensor probe operative to detect an electrical parameter in an insulated conductor without requiring galvanic contact with the insulated conductor may be summarized as including a Rogowski coil having a first end and a second end; a body permanently coupled to the second end of the Rogowski coil, the body comprising a fastener that selectively couples with the first end of the Rogowski coil, the body sized and dimensioned to allow a size of the Rogowski coil to be selectively adjusted via movement of the Rogowski coil relative to the body; and a non-contact sensor coupled to the body, the non-contact sensor operative to sense at least one electrical parameter in the insulated conductor when the insulated conductor is within the loop formed by the Rogowski coil.

An electrical parameter sensor probe operative to detect an electrical parameter in an insulated conductor without requiring galvanic contact with the insulated conductor may be summarized as including a Rogowski coil that receives the insulated conductor therein; at least one non-contact voltage sensor coupled to the Rogowski coil; and a clamp operatively coupled to the Rogowski coil, the clamp operative to be actuated to cause the Rogowski coil to deform such that the at least one non-contact voltage sensor is positioned adjacent the insulated conductor under test.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
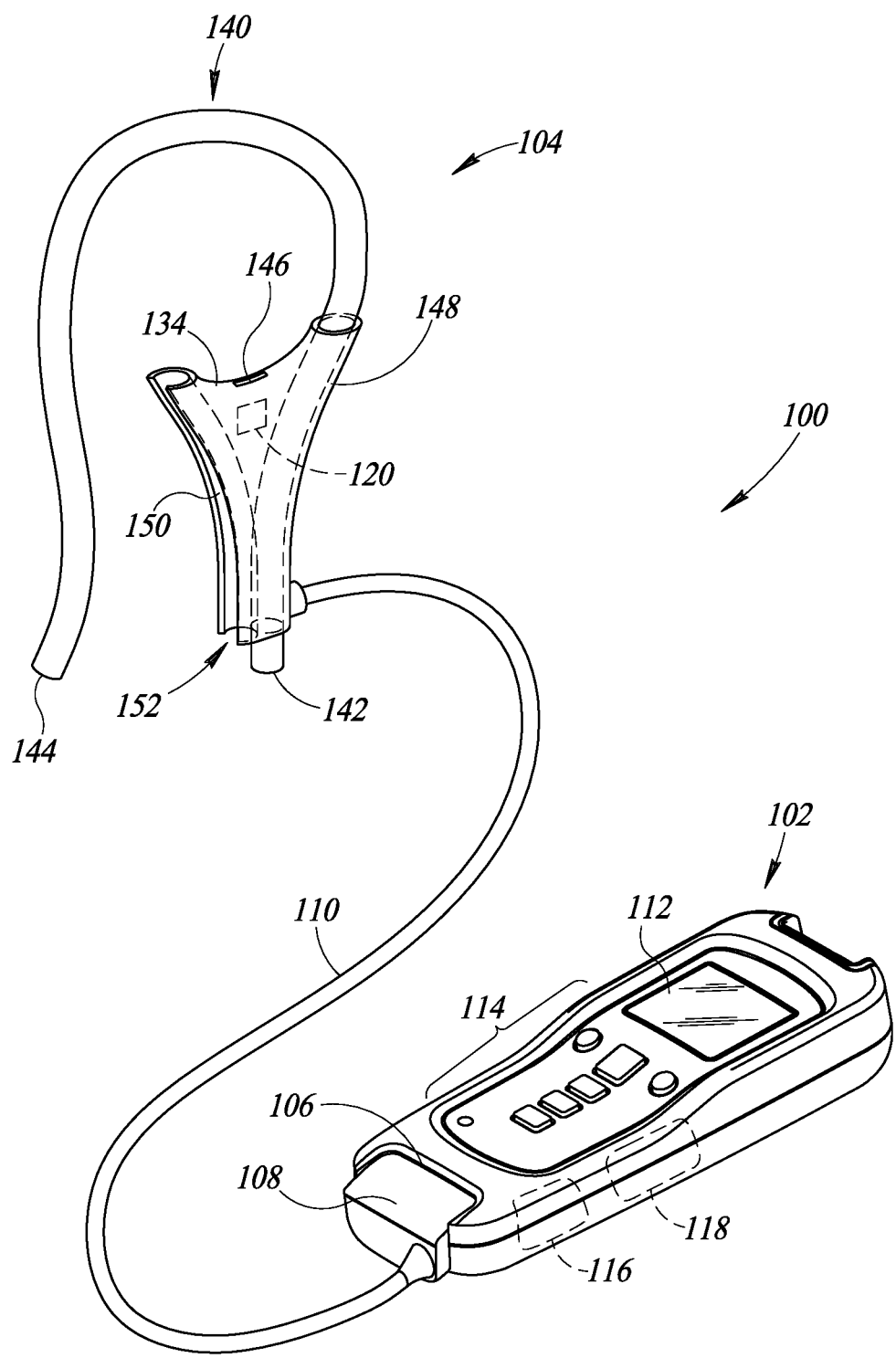
FIG. 1 is a pictorial diagram of an electrical parameter measurement device that includes an electrical parameter sensor probe that includes a Rogowski coil and a non-contact voltage sensor, wherein the Rogowski coil is formable into a loop with an adjustable size, shown with the loop opened to allow an insulated conductor to be received for measurement, according to one non-limiting illustrated implementation.

One or more implementations of the present disclosure are directed to systems and methods for measuring electrical parameters (e.g., voltage, current, power) in an insulated or blank uninsulated conductor (e.g., insulated wire) without requiring a galvanic connection between the conductor and an electrical parameter sensor probe. Generally, a non-galvanic contact (or "non-contact") electrical parameter measurement system or device is provided which measures one or more electrical parameters in an insulated conductor. Such systems which do not require a galvanic connection are referred to herein as "non-contact." As used herein, "electrically coupled" includes both direct and indirect electrical coupling unless stated otherwise.

In at least some implementations, a non-contact, electrical parameter sensor probe is provided that is operative to accurately measure both current and voltage in an insulated conductor under test. The sensor probe includes a body, a Rogowski coil coupled to the body, and a non-contact voltage sensor coupled to at least one of the body or the Rogowski coil. The size of the loop of the Rogowski coil is selectively adjustable, such that the loop may be tightened around an insulated conductor under test until the conductor is positioned adjacent a portion of the body or Rogowski coil that includes the non-contact voltage sensor. Thus, once the loop is tightened to maintain the position of the insulated conductor, the non-contact voltage sensor adjacent the conductor may obtain accurate voltage measurements while the Rogowski coil obtains accurate current measurements. One or more electrical parameters, such as power or phase angle, may be derived using the obtained voltage and current measurements. The measured electrical parameters may be provided to a user, e.g., via a display, or may be transmitted to one or more external systems via a suitable wired or wireless connection.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

FIG. 1 shows a pictorial diagram of an electrical parameter measurement device 100, according to one non-limiting illustrated implementation. The electrical parameter measurement device 100 includes a main body or housing 102 and an electrical parameter sensor probe 104. The sensor probe 104 comprises a body 134 coupled to an interface connector 108 via a cable 110. The main body 102 includes an interface connector 106 that detachably couples with the corresponding interface connector 108 of the sensor probe 104.

The main body 102 further includes a display 112 that presents measurement results and other information, and an input user interface 114 for inputting information such as measurement instructions or other information. The display 112 may be a display of any suitable type, such as a liquid crystal display (LCD), a light-emitting diode (LED) display, an organic LED display, a plasma display, or an e-ink display. The main body 102 may include one or more audio or haptic outputs (not shown), such as one or more speakers, buzzers, vibration devices, etc. In the illustrated implementation, the input user interface 114 comprises a plurality of buttons, but in other implementations the user interface may additionally or alternatively include one or more other types of input devices, such as a touch pad, touch screen, wheel, knob, dial, microphone, etc.

The main body 102 may also include a power supply, such as a battery or battery pack, for supplying power to the various components of the main body and the sensor probe 104. The main body 102 also includes control circuitry 116 that controls the various operations of the electrical parameter measurement device 100, such as receiving signals from the sensor probe 104, determining one or more electrical parameters of an insulated conductor 115 under measurement, and outputting measurement data (e.g., to the display 112). The control circuitry 116 may include one or more processors (e.g., microcontroller, DSP, ASIC, FPGA), one or more types of memory (e.g., ROM, RAM, flash memory, other nontransitory storage media), and/or one or more other types of processing or control related components.

In at least some implementations, the main body 102 may include a wireless communications subsystem 118, which may include one or more of a Bluetooth® module, a Wi-Fi® module, a ZIGBEE® module, a near field communication (NFC) module, etc. The main body 102 may be operative to communicate wirelessly via the wireless communications subsystem 118 with an external receiving system, such as a computer, smart phone, tablet, personal digital assistant, etc., so as to transmit measurement results to the external system or to receive instruction signals or input information from an external system. The main body 102 may additionally or alternatively include a wired communications subsystem, such as a USB interface, etc.

Although only one sensor probe 104 is shown for explanatory purposes, in at least some implementations, a plurality of different sensor probes may be detachably coupleable to the main body 102 of the electrical parameter measurement device 100. The plurality of sensor probes may differ in at least one of shape, structure, or function, for example, to provide various functionality for the electrical parameter measurement device 100.

The sensor probe 104 includes a flexible Rogowski coil 140 that has a length that extends between a first end 142 and a second end 144. As with conventional Rogowski coils, the Rogowski coil 140 may include a toroidal coil having a central wire surrounded by the same wire wound in a helix around a flexible, non-magnetic core and sheathed in a flexible covering. As a result, one end of the coil is taken through the coil itself and brought out the other side so that both ends of the coil are on the same side (e.g., first end 142, second end 144). The ends of the coil may be electrically connected to the signal cable 110 such that signals from the Rogowski coil 140 are sent to the main body 102 for processing. The non-magnetic core may include air, for example. The covering of the Rogowski coil 140 may be sufficiently rigid to protect the form of the toroidal coil, and still be sufficiently flexible to allow the Rogowski coil to be formed into a loop that is adjustable in size and shape, as discussed further below.

The body 134 of sensor probe 104 includes one or more non-contact sensors 146 (e.g., a non-contact voltage sensor) coupled thereto that are operative to sense one or more electrical parameters in an insulated conductor 115 under test. Additionally or alternatively, one or more non-contact sensors 146 may be coupled to the Rogowski coil instead of the body 134 of the sensor probe 104. The non-contact sensor 146 may be electrically connected to the signal cable 110 such that signals from the sensor are sent to the main body 102 for processing. The non-contact sensors may include a non-contact voltage sensor, a Hall Effect element, a current transformer, a fluxgate sensor, an anisotropic magnetoresistance (AMR) sensor, a giant magnetoresistance (GMR) sensor, or other types of sensors operative to sense an electrical parameter of the conductor 115 without requiring galvanic contact. Various non-limiting examples of non-contact sensors are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

The sensor probe 104 may also include processing or control circuitry 120 operatively coupled to the one or more sensors 146 that is operative to process sensor signals received from the one or more sensors 146 or the Rogowski coil 140, and is operative to send sensor data indicative of such sensor signals to the control circuitry 116 of the main body 102 for processing. The control circuitry 120 may additionally or alternatively include conditioning or conversion circuitry that is operative to condition or convert the signals into a form receivable by the main body 102, such as an analog form (e.g., 0-1 V) or a digital form (e.g., 8 bits, 16 bits, 64 bits).

Figure 2:
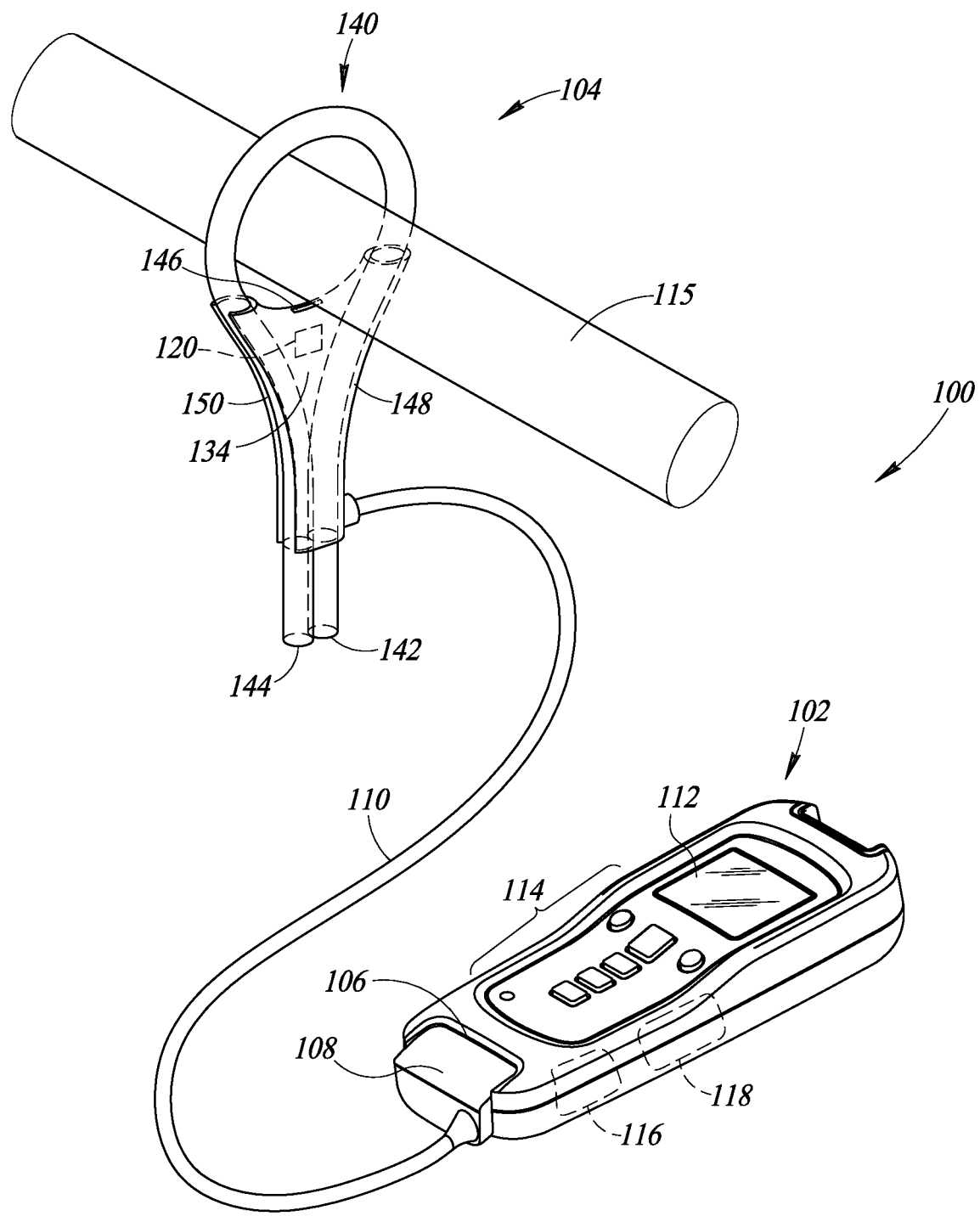
FIG. 2 is a pictorial diagram of the electrical parameter measurement device of FIG. 1, shown with the loop of the Rogowski coil closed and tightened around an insulated conductor under test to position the conductor adjacent the non-contact voltage sensor, according to one non-limiting illustrated implementation.
Figure 4:
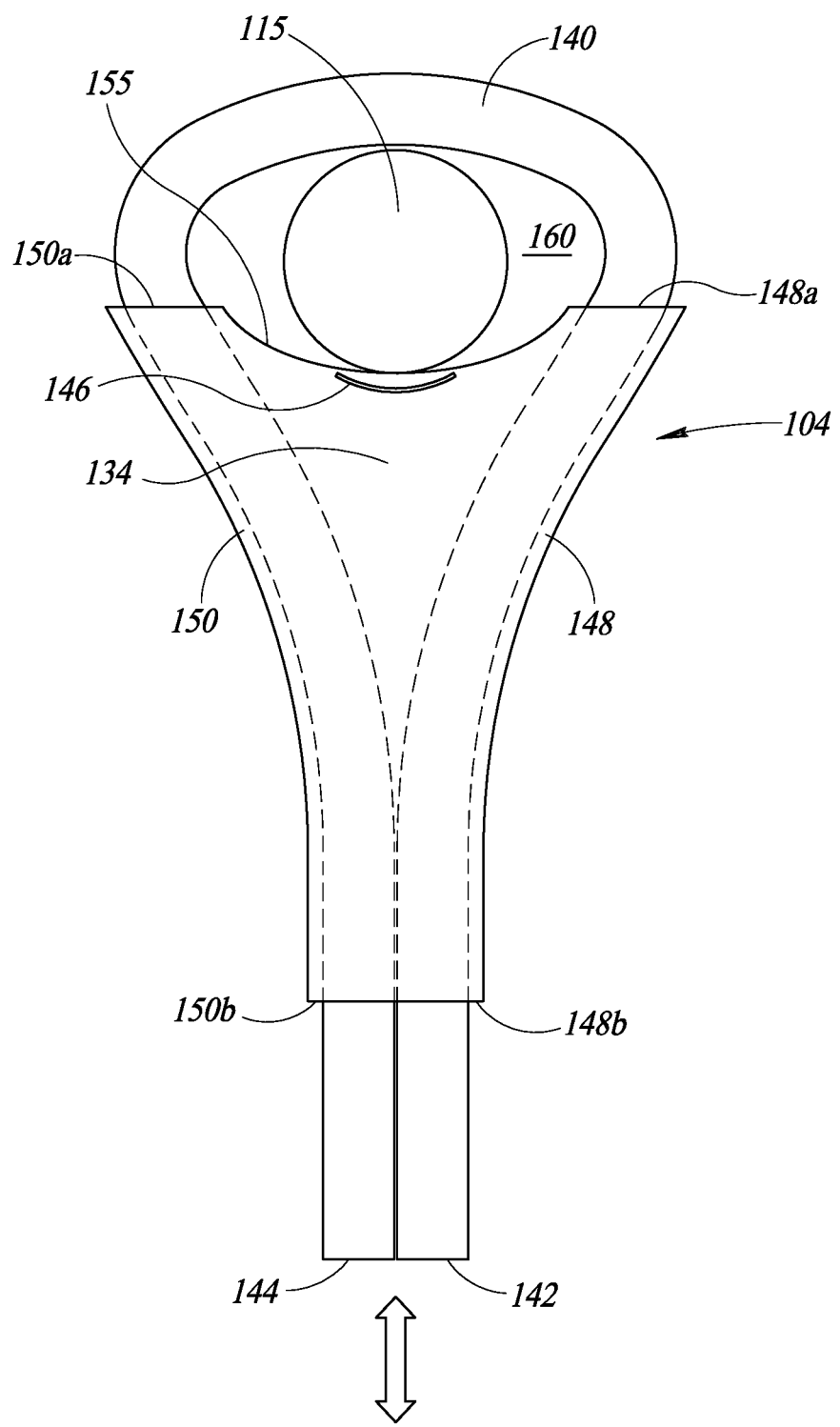
FIG. 4 is a pictorial diagram of the electrical parameter sensor probe, shown with the loop of the Rogowski coil tightened around the insulated conductor under test, wherein the insulated conductor is positioned adjacent the non-contact voltage sensor, according to one non-limiting illustrated implementation.

To obtain a measurement using the non-contact voltage sensor 146, it may be advantageous for the sensor to be as close as possible to the conductor 115 under test. In at least some implementations, it may also be advantageous for the conductor 115 to be positioned at a particular orientation (e.g., perpendicular) relative to the non-contact sensor 146. With conventional Rogowski coils that have relatively large, non-adjustable loops (e.g., 10 inches, 18 inches), the Rogowski coil hangs off of an inductor under test at a point that is spaced apart from the body 134 of the sensor probe 104. From this position, it may be difficult or impossible for a non-contact voltage sensor to obtain accurate voltage measurements in the conductor under test. As discussed further below, in one or more implementations of the present disclosure, the loop of the Rogowski coil 140 is selectively adjustable such that, as shown in FIGS. 2 and 4, the loop may be tightened around the conductor 115 to position the conductor adjacent the non-contact sensor 146 so that an accurate measurement may be obtained.

Figure 3:
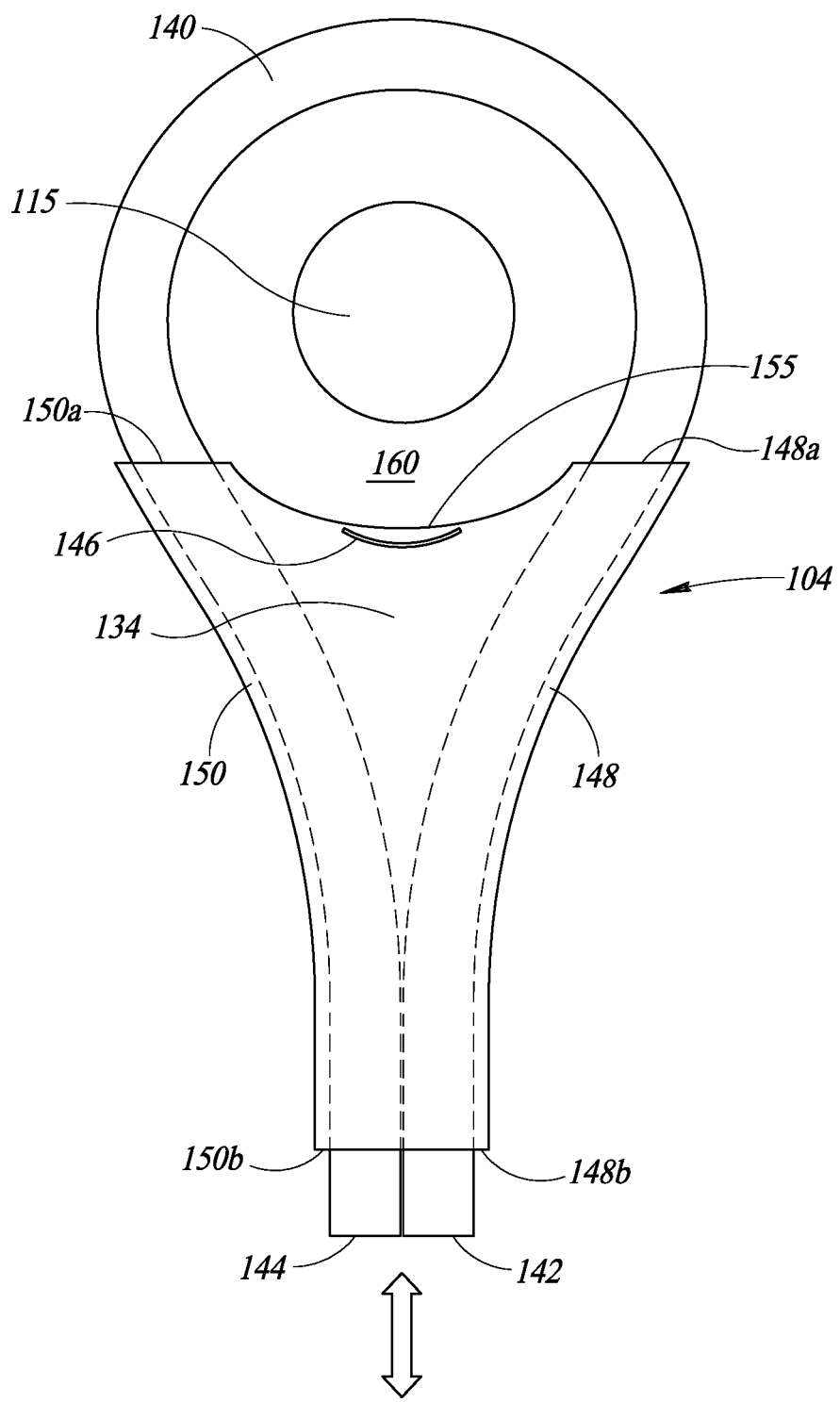
FIG. 3 is a pictorial diagram of the electrical parameter sensor probe, shown with the loop of the Rogowski coil loosened around the insulated conductor under test, according to one non-limiting illustrated implementation.

As shown best in FIG. 3, the body 134 of the sensor probe 104 includes a first channel 148 and a second channel 150 that each slidably receives a portion of the Rogowski coil 140. The first and second channels 148 and 150, respectively, have respective open first ends 148a and 150a and respective open second ends 148b and 150b. The first ends 148a and 150a of the first and second channels 148 and 150, respectively, are spaced apart from each other, and the second ends 148a and 150b of the first and second channels, respectively, are adjacent each other. Each of the first and second channels 148 and 150 is sized and dimensioned to slidably contain a respective length of the Rogowski coil 140 therein such that a loop of the Rogowski coil is formed between the respective first open ends 148a and 150a of the first and second channels 148 and 150, respectively, and the size of the loop is selectively adjustable by movement of the Rogowski coil within at least one of the first and second channels. Further, the two channels 148 and 150 converge at the seconds 148b and 150b to be adjacent each other, which provides the Rogowski coil 140 with an overall shape that yields accurate measurements.

Figure 5:
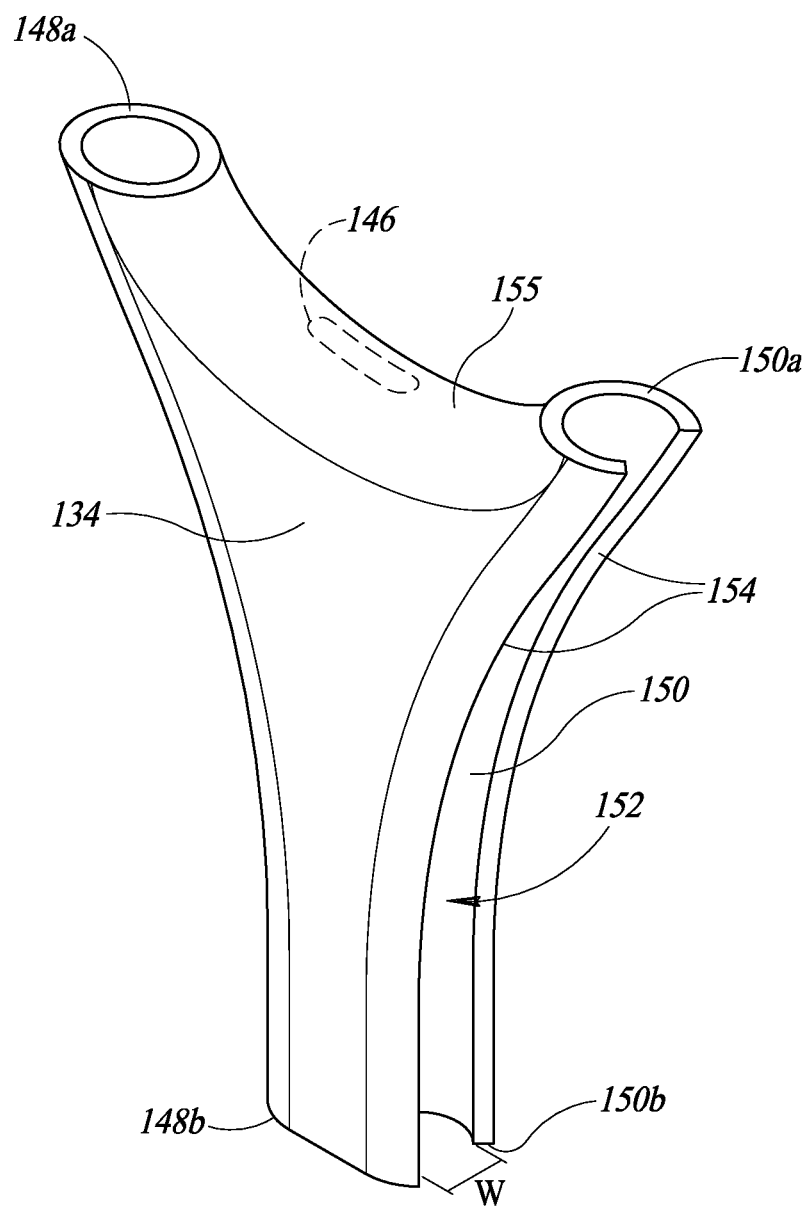
FIG. 5 is a pictorial diagram of a body of the electrical parameter sensor probe, showing a lateral opening in a channel of the body which allows a length of the Rogowski coil to be removably coupled to the body so that a conductor under test may be positioned inside the loop of the Rogowski coil, according to one non-limiting illustrated implementation.

As shown in FIG. 1, the first end 142 of the Rogowski coil 140 may maintained (e.g., permanently) within the first channel 148, and the second end 144 may be selectively removable from the second channel 150 via a lateral opening 152 (see FIG. 5) that extends between the first end 150a and the second end 150b. As an example, a portion of the first end 142 of the Rogowski coil 140 may be larger than the opening in the second end 148b of the first channel 148 to prevent the Rogowski coil from being removed from the first channel.

When the second end 144 of the Rogowski coil 140 is separated from the body 134 as shown in FIG. 1, the conductor 115 may then be positioned within a loop opening 160 (FIG. 3) proximate the body 134 of the sensor probe 104. The second end 144 may then be coupled to the body 134 via the lateral opening 152 to secure the conductor 115 within the loop opening 160. The lateral opening 152 may be sized and dimensioned to allow a length of the Rogowski coil 140 to be selectively inserted into and removed from the second channel 150. In at least some implementations, the lateral opening 152 has a width (W) (FIG. 5) that is slightly less than a diameter of the Rogowski coil 140. In such implementations, at least a portion 154 (FIG. 5) of the second channel 150 adjacent the lateral opening 152 may be formed from a flexible material (e.g., elastomer) that elastically deforms to allow the length of the Rogowski coil 140 to be selectively inserted into and removed from the second channel (e.g., "snapped" into and out of the channel).

Once the conductor 115 is positioned inside the loop opening 160 as shown in FIG. 3, the user may grasp the first and second ends 142 and 144 of the Rogowski coil 140 and pull them downward (as shown) relative to the body 134 of the sensor probe 104, which causes the size of the loop to be reduced such that the loop is tightened around the conductor, as shown in FIG. 4. Once the loop of the Rogowski coil 140 has been tightened as shown in FIG. 4, the conductor 115 is securely positioned adjacent a location 155 of the body 134 that includes the non-contact voltage sensor 146. Then, the sensor probe 104 may then be used to detect a voltage in the conductor 115 using the non-contact voltage sensor 146, and to detect a current in the conductor using the Rogowski coil 140 positioned around the conductor. In at least some implementations, the user may be instructed to keep the first and second ends 142 and 144 aligned with each other, as shown in FIGS. 3 and 4. In other implementations, a coupler may be provided to couple the first and second ends 142 and 144 together to maintain the ends in an aligned relationship.

To remove the conductor 115 from the loop opening 160, the user may grasp the Rogowski coil 140 above (as shown) the conductor 115 and pull the coil upward to loosen the loop of the Rogowski coil. The second end 144 of the Rogowski coil 140 may then be decoupled from the body 134 via the lateral opening 152 in the second channel 150, as discussed above. Once the second end 144 of the Rogowski coil 140 is decoupled from the body 134, as shown in FIG. 1, the conductor 115 may be separated from the sensor probe 104.

It should be appreciated that the lateral opening 152 in the second channel 150 provide just one example of a fastener that allow the second end 144 of the Rogowski coil 140 to be selectively coupled to the body 134. In other implementations, different types of fasteners may be used which permit selective coupling of at least one portion of the Rogowski coil, while allowing for adjustment of the size of the loop of the Rogowski coil.

In at least some implementations, in operation, the control circuitry 120 of the sensor probe 104 transmits measurement data from the sensor(s) 146 or the Rogowski coil 140 to the main body 102 of the electrical parameter measurement device 100, and the control circuitry 116 determines one or more electrical parameters in the conductor 115 based on the received measurement data. For example, the control circuitry 116 may utilize one or more mathematical formulas, lookup tables, calibration factors, etc., to determine the one or more electrical parameters. Further, some electrical parameters, such as power or phase angles, may be derived from other determined electrical parameters, such as current and voltage.

As noted above, the interface connector 108 may be detachably coupled with the corresponding interface connector 106 on the main body 102 of the electrical parameter measurement device 100, for example, such that different sensor probes may be coupled to the main body 102. In at least some implementations, the interface connector 108 of the sensor probe 104 may be configured as one of a plug and a socket, and the interface connector 106 of the main body 102 may be configured as the other of a plug and socket. In other implementations, the interface connectors 106 and 108 may be configured as different types of connectors that are operative to be detachably coupled to each other.

Further, in some implementations, the sensor probe 104 may be fixedly connected to the main body 102 by the cable 110. In other implementations, the sensor probe 104 and the main body 102 may be formed together in a single housing, such that the cable 110 is not required.

Figure 6A:
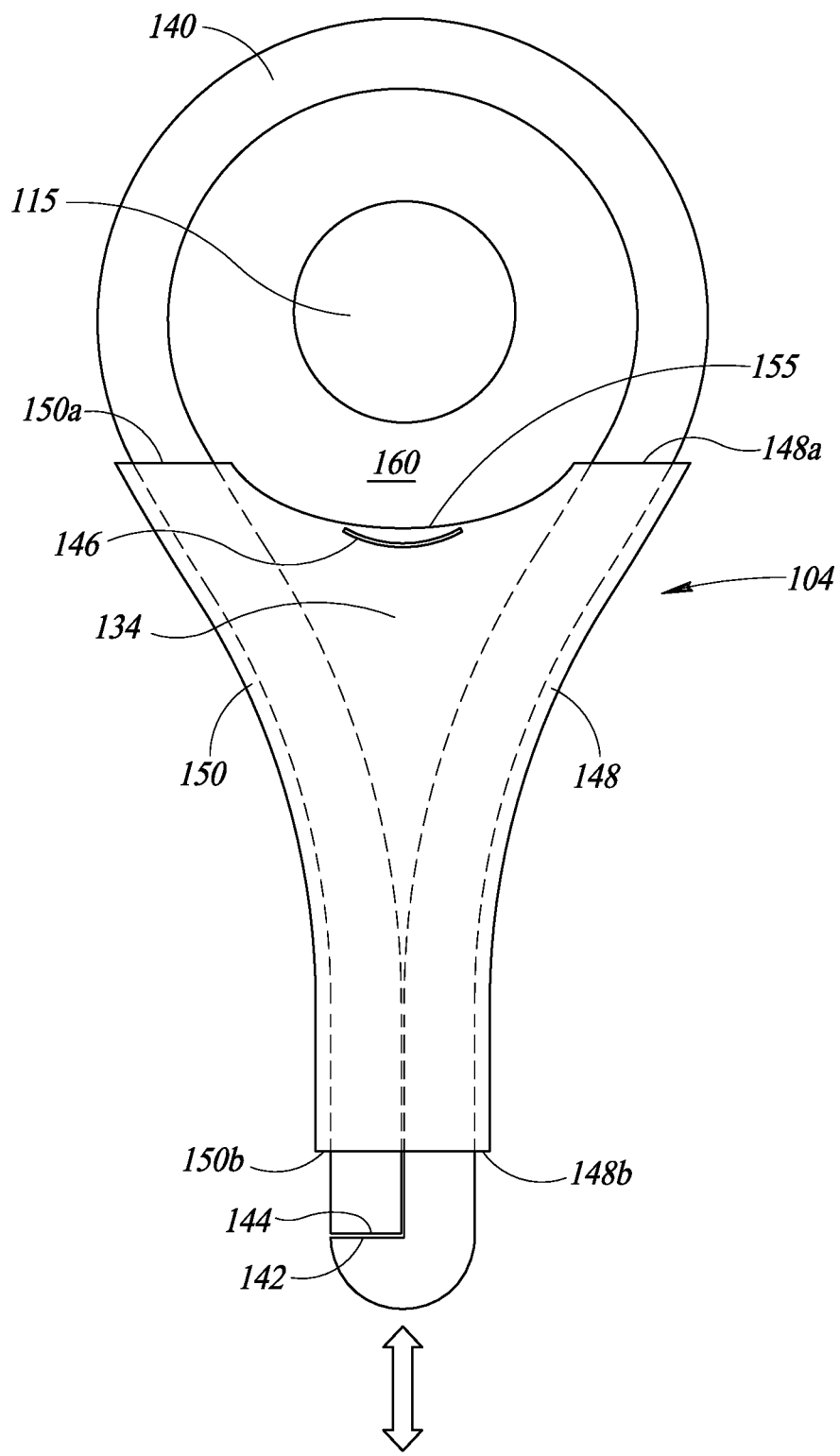
FIG. 6A is a pictorial diagram of an electrical parameter sensor probe, shown with a Rogowski coil that includes first and second ends that abut one another, according to one non-limiting illustrated implementation.
Figure 6B:
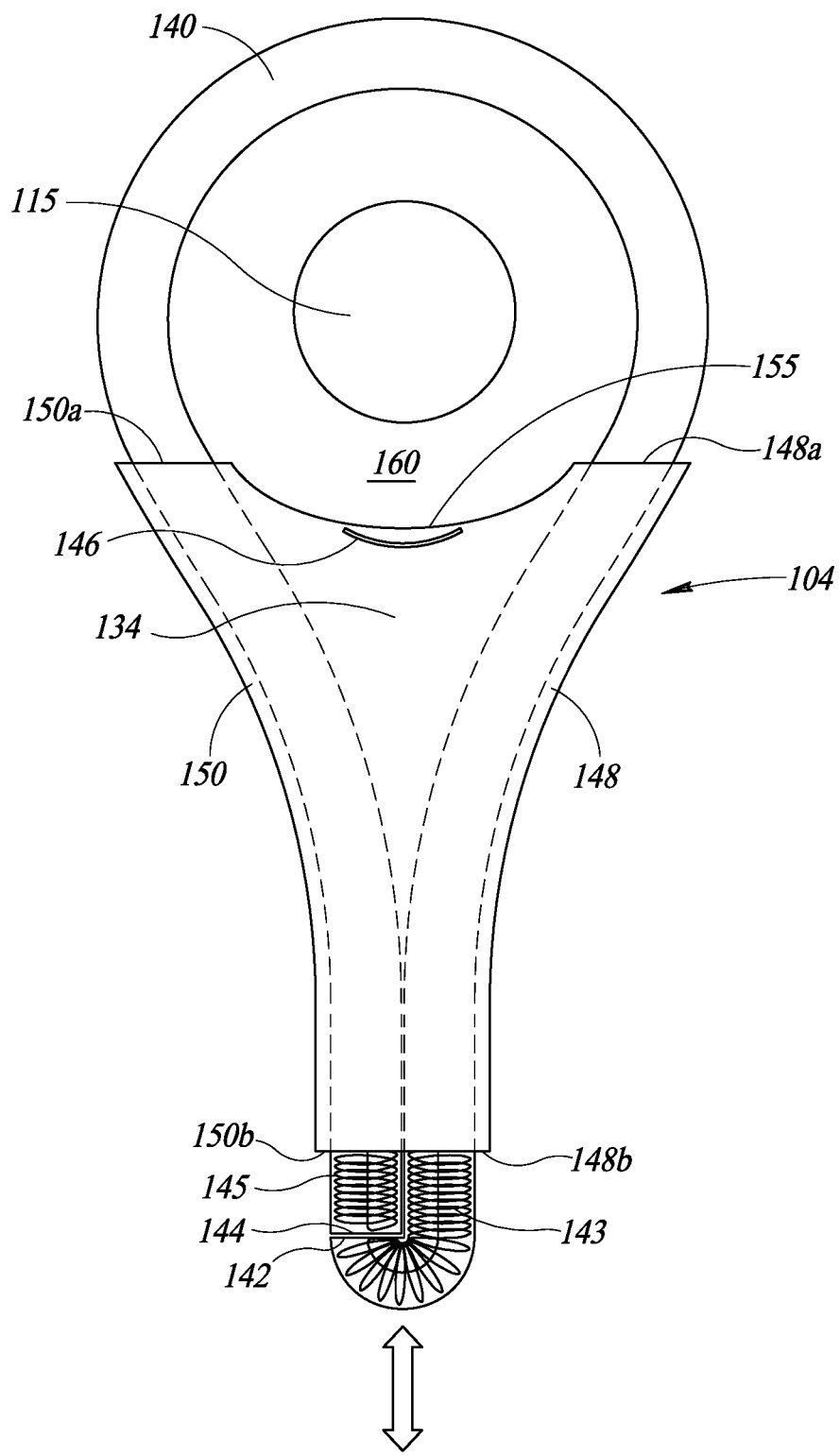
FIG. 6B is a pictorial diagram of the electrical parameter sensor probe of FIG. 6A, showing the coil of the Rogowski coil at the first and second ends, according to one non-limiting illustrated implementation.

FIG. 6A is a pictorial diagram of a modified version of the electrical parameter sensor probe 104 also shown in FIG. 3. FIG. 6B shows first and second ends 143 and 145 of the conductive coil winding inside the sheath of the Rogowski coil 140. In this implementation, the first end 142 of the Rogowski coil 140 is curved into a U-shape such that the first and second ends 142 and 144 abut each other. This confirmation may provide a further improvement in accuracy since the ends 143 and 145 of the coil winding abut each other for better coupling. This feature minimizes the air gap and therefore improves accuracy by better suppression of the influence of nearby external wires.

Figure 7A:
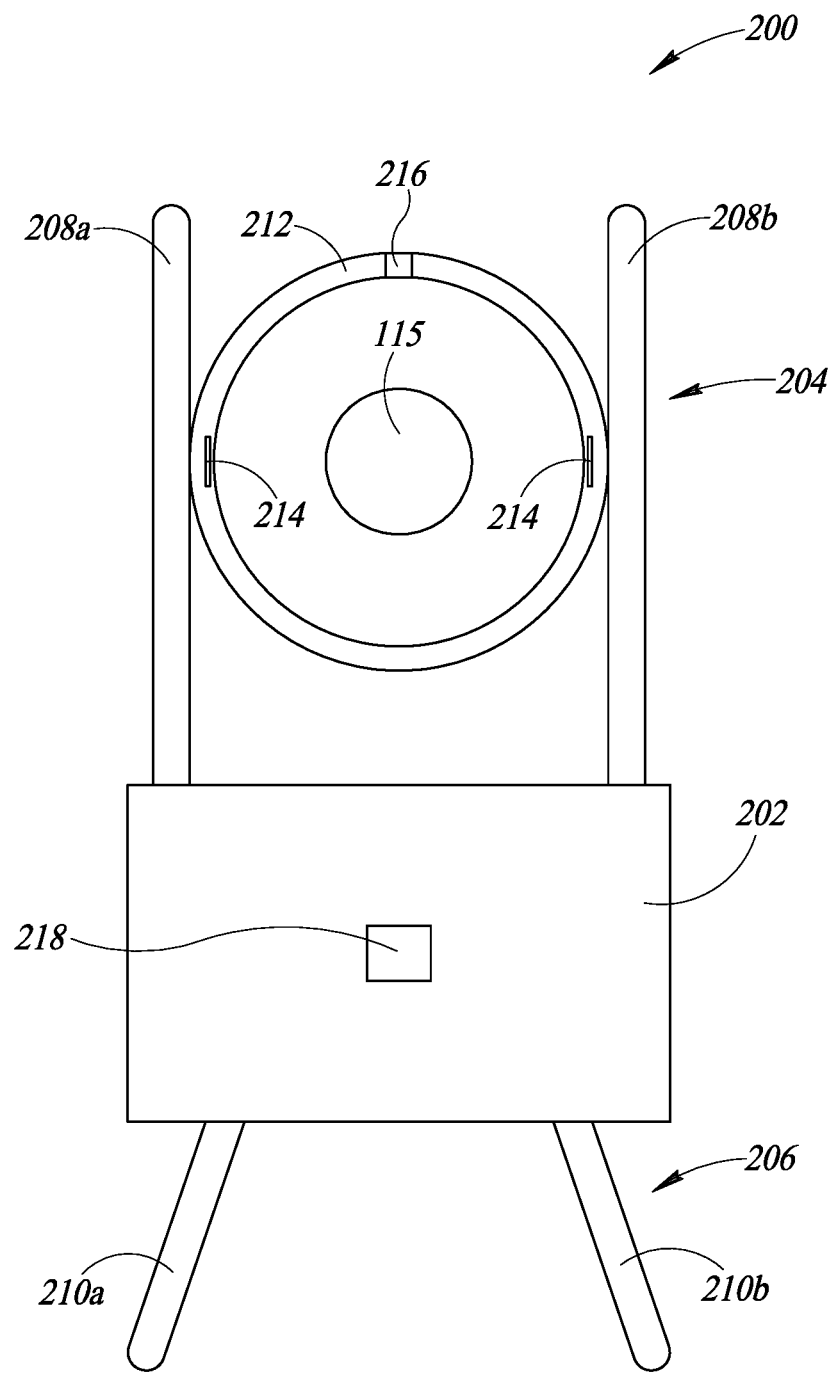
FIG. 7A is a pictorial diagram of an electrical parameter clamp probe that includes a Rogowski coil, the clamp probe shown in an unclamped state, according to one non-limiting illustrated implementation.
Figure 7B:
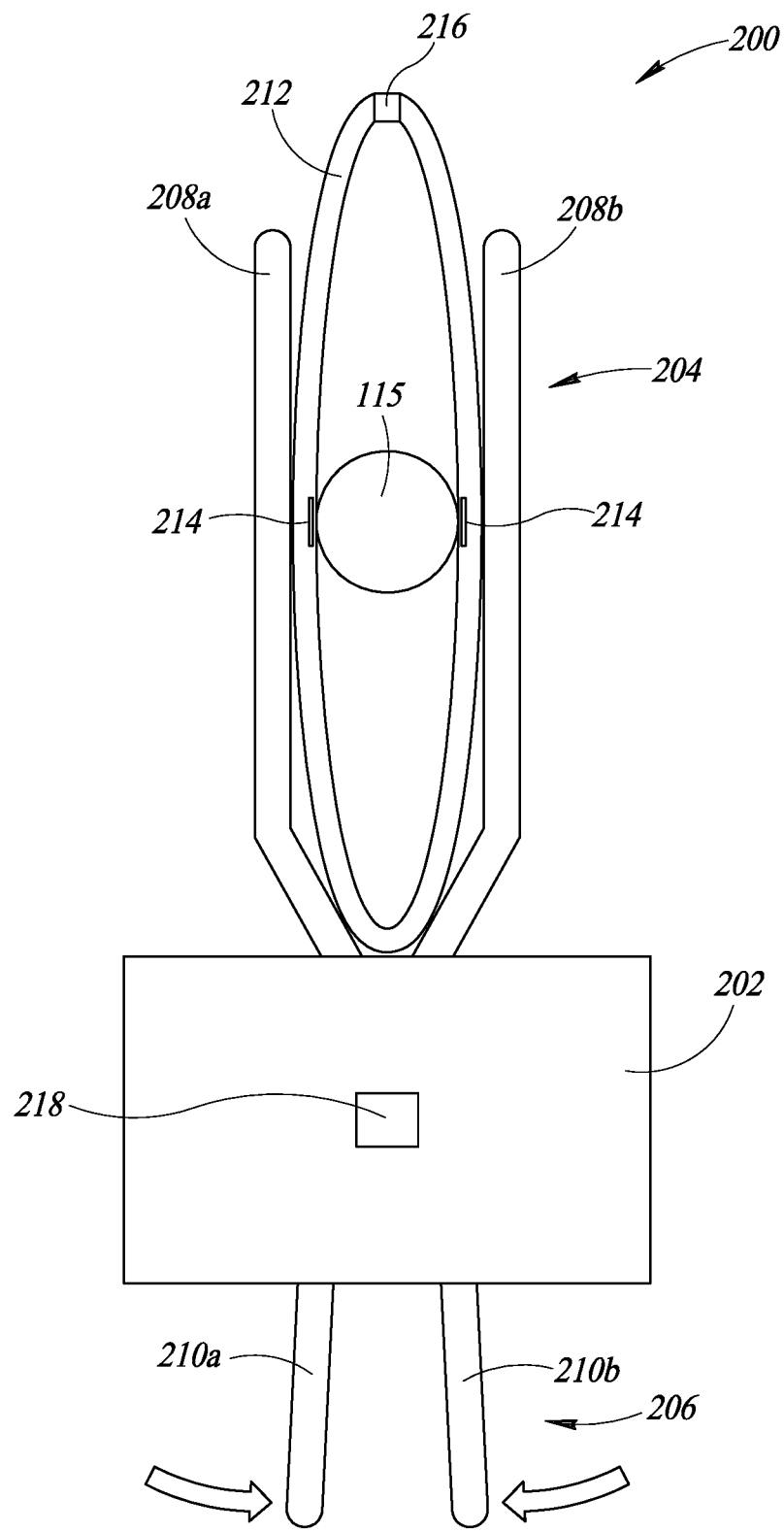
FIG. 7B is a pictorial diagram of the electrical parameter sensor clamp probe of FIG. 7A, the clamp probe shown in a clamped state wherein the Rogowski coil is deformed around an insulated conductor under test, and at least one non-contact sensor positioned on the Rogowski coil is positioned adjacent the insulated conductor to obtain an electrical parameter measurement, according to one non-limiting illustrated implementation.

FIGS. 7A and 7B illustrate another implementations of an electrical parameter measurement device 200, according to one non-limiting illustrated implementation. Many of the features and components of the electrical parameter measurement device 200 may be similar or identical to the electrical parameter measurement device 100 discussed above. Thus, the discussion above with regard to the electrical parameter measurement device 100 may also apply to the electrical parameter measurement device 200.

The electrical parameter measurement device 200 includes a body portion 202, a clamp portion 204, and a gripping portion 206. The clamp portion 204 may include two clamp arms 208a and 208b that are movable with respect to each other between an unclamped or open position shown in FIG. 7A, and a clamped or closed position shown in FIG. 7B. The gripping portion 206 may include two grip arms 210a and 210b that are movable with respect to each other to actuate the clamp portion from the unclamped position into the clamped position. As an example, the body portion 202 may include a biasing element 218 (e.g., spring, pin) that biases the clamp arms 208a and 208b in the unclamped position shown in FIG. 7A. In operation, the user may squeeze the grip arms 210a and 210b together to cause the clamp arms 208a and 208b to move into clamped position against the force of the biasing element 218.

The electrical parameter measurement device 200 includes a Rogowski coil 212 positioned between the clamp arms 208a and 208b. One or more non-contact voltage sensors 214 (two shown) are coupled to the Rogowski coil 212. As an example, the Rogowski coil 212 may include a connector 216 that allows the loop of the Rogowski coil to be selectively opened to position the insulated conductor 115 under test into the coil, and then reconnected to close the loop.

Once the insulated conductor 115 is positioned within the loop of the Rogowski coil 212, the user may squeeze the grip arms 210a and 210b of the grip portion 206 to cause the clamp arms 208a and 208b to deform the Rogowski coil 212 such that the non-contact sensors 214 are positioned adjacent the insulated conductor 115 under test. Then, the electrical parameter measurement device 200 may then be used to detect a voltage in the conductor 115 using the non-contact voltage sensors 214, and to detect a current in the conductor using the Rogowski coil 212 positioned around the conductor. As discussed above, the measured electrical parameters may be provided to a user, e.g., via a display, or may be transmitted to one or more external systems via a suitable wired or wireless connection.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An electrical parameter sensor probe operative to detect an electrical parameter in an insulated conductor without requiring galvanic contact with the insulated conductor, the electrical parameter sensor probe comprising:
   a Rogowski coil;
   a body comprising a first channel and a second channel, the first and second channels having respective first and second open ends, the respective first ends of the first and second channels being spaced apart from each other, and the respective second ends of the first and second channels being adjacent each other, each of the first and second channels sized and dimensioned to slidably contain a respective length of the Rogowski coil therein such that a loop of the Rogowski coil is formed between the respective first open ends of the first and second channels, and a size of the loop is selectively adjustable by movement of the Rogowski coil within the first channel with a first portion of the Rogowski coil passing the respective second end of the first channel and within the second channel with a second portion of the Rogowski coil passing the respective second end of the second channel; and
   a non-contact sensor coupled to the body and positioned between the respective first ends of the first and second channels, the non-contact sensor operative to sense at least one electrical parameter in the insulated conductor when the insulated conductor is within the loop formed by the Rogowski coil.

2. The electrical parameter sensor probe of claim 1, wherein the second channel of the body comprises a lateral opening that extends between the first and second open ends, the lateral opening sized and dimensioned to allow a length of the Rogowski coil to be selectively inserted into and removed from the second channel.

3. The electrical parameter sensor probe of claim 2, wherein the lateral opening has a width that is less than a diameter of the Rogowski coil, and at least a portion of the second channel adjacent the lateral opening is formed from a flexible material that elastically deforms to allow the length of the Rogowski coil to be selectively inserted into and removed from the second channel.

4. The electrical parameter sensor probe of claim 1, wherein the second channel of the body comprises a fastener operative to allow a length of the Rogowski coil to be selectively inserted into and removed from the second channel.

5. The electrical parameter sensor probe of claim 1, wherein the Rogowski coil is not removable from the first channel during normal use of the electrical parameter sensor probe.

6. The electrical parameter sensor probe of claim 1, wherein the non-contact sensor comprises at least one of a non-contact voltage sensor or a non-contact current sensor.

7. The electrical parameter sensor probe of claim 1, further comprising:
a non-contact voltage sensor coupled to the Rogowski coil, the non-contact voltage sensor operative to sense a voltage in the insulated conductor when the insulated conductor is within the loop formed by the Rogowski coil.

8. The electrical parameter sensor probe of claim 1, further comprising an interface connector operatively coupled to the non-contact sensor and the Rogowski coil, the interface connector being detachably coupleable to a corresponding interface connector of a main body of a non-contact electrical parameter measurement device.

9. The electrical parameter sensor probe of claim 1 wherein the non-contact sensor comprises at least one of a non-contact voltage sensor, a Hall Effect sensor, a fluxgate sensor, an anisotropic magnetoresistance (AMR) sensor, or a giant magnetoresistance (GMR) sensor.

10. The electrical parameter sensor probe of claim 1 wherein the Rogowski coil includes a first end and a second end, at least one of the first end and the second end being curved such that the first and second ends abut each other to minimize an air gap between a winding of the Rogowski coil at the first and second ends.

11. A device for measuring an electrical parameter in an insulated conductor, the device comprising:
an electrical parameter sensor probe, comprising:
a Rogowski coil;
a body comprising a first channel and a second channel, the first and second channels having respective first and second open ends, the respective first ends of the first and second channels being spaced apart from each other, and the respective second ends of the first and second channels being adjacent each other, each of the first and second channels sized and dimensioned to slidably contain a respective length of the Rogowski coil therein such that a loop of the Rogowski coil is formed between the respective first open ends of the first and second channels, and a size of the loop is selectively adjustable by movement of the Rogowski coil within the first channel with a first portion of the Rogowski coil passing the respective second end of the first channel and within the second channel with a second portion of the Rogowski coil passing the respective second end of the second channel; and
a non-contact sensor coupled to the body and positioned between the respective first ends of the first and second channels, the non-contact sensor operative to sense at least one electrical parameter in the insulated conductor when the insulated conductor is within the loop formed by the Rogowski coil; and
control circuitry communicatively coupleable to the non-contact sensor and the Rogowski coil, in operation, the control circuitry:
receives sensor data indicative of signals detected at least one of the non-contact sensor or the Rogowski coil; and
processes the received sensor data to determine at least one electrical parameter of the insulated conductor.

12. The device of claim 11, further comprising a main body that contains the control circuitry.

13. The device of claim 12, wherein the main body comprises at least one interface connector, and the electrical parameter sensor probe is detachably connectable to the at least one interface connector of the main body.

14. The device of claim 11, further comprising a main body that includes the electrical parameter sensor probe and the control circuitry.

15. The device of claim 11, wherein the control circuitry, in operation, processes the received sensor data to determine a voltage in the insulated conductor.

16. The device of claim 11, wherein the control circuitry, in operation, processes the received sensor data to determine a voltage and a current in the insulated conductor.

17. The device of claim 11, further comprising:
a wireless communications subsystem operatively coupled to the control circuitry, in operation, the wireless communication subsystem wirelessly transmits the determined at least one electrical parameter to an external system.

18. The device of claim 11, further comprising:
a display that, in operation, visually presents the determined at least one electrical parameter to a user of the device.

19. The device of claim 11 wherein the non-contact sensor comprises at least one of a non-contact voltage sensor, a Hall Effect sensor, a fluxgate sensor, an anisotropic magnetoresistance (AMR) sensor, or a giant magnetoresistance (GMR) sensor.

\* \* \* \* \*